United States Patent
Chung et al.

(10) Patent No.: US 10,203,578 B2
(45) Date of Patent: Feb. 12, 2019

(54) DISPLAY PANEL HAVING HIGHER TRANSMITTANCE AND MANUFACTURING METHOD THEREOF

(71) Applicant: InnoLux Corporation, Miao-Li County (TW)

(72) Inventors: Yueh-Ting Chung, Miao-Li County (TW); Yung-Hsin Lu, Miao-Li County (TW); Jyun-Yu Chen, Miao-Li County (TW); Jian-Min Leu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/496,730

(22) Filed: Apr. 25, 2017

(65) Prior Publication Data
US 2017/0307920 A1    Oct. 26, 2017

(30) Foreign Application Priority Data
Apr. 26, 2016 (CN) .......................... 2016 1 0264400

(51) Int. Cl.
*H01L 29/417* (2006.01)
*H01L 29/49* (2006.01)
(Continued)

(52) U.S. Cl.
CPC ........ *G02F 1/1368* (2013.01); *G02F 1/13458* (2013.01); *G02F 1/133345* (2013.01);
(Continued)

(58) Field of Classification Search
CPC ........... G02F 2001/1635; G02F 1/1368; G02F 1/136227; G02F 1/133345; G02F 1/136286; G02F 1/134309; G02F 2201/123; G02F 2201/121; G02F 2001/134345; G02F 2001/136295; G02F 2203/01; G02F 2001/13685; G02F 2001/133388; G02F 2001/133391; G09G 2300/043; H01L 27/3248; H01L 27/3251; H01L 27/3258; H01L 27/3262; H01L 27/3272; H01L 27/124; H01L 29/4908; H01L 2924/13069
(Continued)

(56) References Cited

U.S. PATENT DOCUMENTS 7,176,496 B2 * 2/2007 Baek ................. G02F 1/136286
                                                          257/149
2016/0126494 A1 * 5/2016 Jung .................... H01L 27/3258
                                                          257/72

* cited by examiner

*Primary Examiner* — Marcos D Pizarro
*Assistant Examiner* — Nelson Garces
(74) *Attorney, Agent, or Firm* — Muncy, Geissler, Olds & Lowe, P.C.

(57) ABSTRACT

A display panel includes a TFT substrate, which includes a substrate, a plurality of scan lines, a plurality of data lines, and a first intermediate layer. The scan lines are disposed on the substrate along a first direction, and the scan lines are intersected with the data lines to define a plurality of sub-pixel units. The sub-pixel units include a first sub-pixel unit and a second sub-pixel unit. The first sub-pixel unit has a first light transmission area and a first component installation area, and the second sub-pixel unit has a second light transmission area and a second component installation area. The first intermediate layer is disposed on the substrate and has an opening. The opening is at least partially overlapped with the first light transmission area, and is at least partially overlapped with the second light transmission area.

11 Claims, 10 Drawing Sheets

(51) Int. Cl.
    *G02F 1/1345*         (2006.01)
    *G02F 1/1368*         (2006.01)
    *G02F 1/1343*         (2006.01)
    *G02F 1/1362*         (2006.01)
    *G02F 1/1333*         (2006.01)
    *H01L 27/12*          (2006.01)

(52) U.S. Cl.
    CPC .. G02F 1/134309 (2013.01); G02F 1/136227 (2013.01); G02F 1/136286 (2013.01); H01L 29/41733 (2013.01); H01L 29/4908 (2013.01); *G02F 2001/13685* (2013.01); *G02F 2001/134345* (2013.01); *G02F 2001/136295* (2013.01); *G02F 2201/121* (2013.01); *G02F 2201/123* (2013.01); *G02F 2203/01* (2013.01); *H01L 27/124* (2013.01)

(58) Field of Classification Search
    USPC .......................................... 257/72, 149–166
    See application file for complete search history.

DISPLAY PANEL HAVING HIGHER TRANSMITTANCE AND MANUFACTURING METHOD THEREOF

CROSS REFERENCE TO RELATED APPLICATIONS

This Non-provisional application claims priority under 35 U.S.C. § 119(a) on Patent Application No(s). 201610264400.2 filed in People's Republic of China on Apr. 26, 2016, the entire contents of which are hereby incorporated by reference.

BACKGROUND

Technical Field

This disclosure relates to a display panel and a manufacturing method thereof, and in particular, to a display panel and a manufacturing method thereof having higher transmittance.

Related Art

With the development of technologies, flat display devices have been widely applied to various fields. Due to the advantages such as low power consumption, less weight, compact size and less radiation, the liquid crystal display (LCD) devices have gradually replaced the traditional cathode ray tube display (CRT) display devices and been applied to various electronic products, such as mobile phones, portable multimedia devices, notebook computers, liquid crystal TVs and liquid crystal screens.

When the resolution (or PPI value) of the display device becomes higher and higher, the transmittance and aperture ratio of the display panel will be correspondingly lower and lower. This will increase the power consumption of the display device. Accordingly, it is desired to improve the transmittance of the display device.

Taking LCD display as an example, the LCD device mainly includes a LCD panel and a backlight module, which are disposed opposite to each other. The LCD panel includes a plurality of sub-pixel units arranged in an array. When the light emitted from the backlight module evenly irradiates the display panel, the sub-pixels of the display panel can display colors to form an image. In general, each sub-pixel unit has a component installation area and a light transmission area. The component installation area is configured for disposing, for example, the TFT, and the light transmission area allows the light to pass through. The display panel can display the image by the light transmission area. However, in the manufacturing process for disposing the TFTs on the substrate, the component installation area and light transmission area are deposited with different intermediate thin films, such as the deposition buffer layer, insulation layer or planarization layer. Unfortunately, when the light passes through the thin films configured in the light transmission area, it will be absorbed or reflected by these thin films, which can lower the transmittance of the display panel.

Therefore, it is an important to provide a display panel having a higher transmittance and a manufacturing method thereof.

SUMMARY

An objective of the present disclosure is to provide a display panel having a higher transmittance and a manufacturing method thereof.

The present disclosure discloses a display panel including a TFT substrate, which includes a substrate, a plurality of scan lines, a plurality of data lines, and a first intermediate layer. The scan lines are disposed on the substrate along a first direction. The scan lines are intersected with the data lines to define a plurality of sub-pixel units. The sub-pixel units include a first sub-pixel unit and a second sub-pixel unit, which are disposed adjacent to each other along the first direction. The first sub-pixel unit has a first light transmission area and a first component installation area, and the second sub-pixel unit has a second light transmission area and a second component installation area. The first intermediate layer is disposed on the substrate and has an opening. The opening is at least partially overlapped with the first light transmission area, and is at least partially overlapped with the second light transmission area.

The present disclosure also discloses a manufacturing method of a display panel, which includes the following steps of: providing a substrate; forming a first metal layer on the substrate so as to form a plurality of scan line extending along a first direction and gates of TFTs located in a first sub-pixel unit and a second sub-pixel unit, wherein the first sub-pixel unit and the second sub-pixel unit are disposed adjacent to each other along the first direction, the first sub-pixel unit has a first light transmission area and a first component installation area, and the second sub-pixel unit has a second light transmission area and a second component installation area; forming a channel layer of the TFTs on the substrate; forming an intermediate layer of the TFTs on the substrate; forming an opening in the intermediate layer, so that the opening is at least partially overlapped with the first light transmission area and is at least partially overlapped with the second light transmission area; and after forming the opening, forming a second metal layer on the substrate so as to form a plurality of data lines and sources and drains of the TFTs, wherein a part of the second metal layer is positioned above the intermediate layer, and another part of the second metal layer is positioned in the opening of the intermediate layer.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements. Moreover, the drawings of all implementation are schematic, and they do not mean the actual size and proportion. The terms of direction recited in the disclosure, for example up, down, left, right, front, or rear, only define the directions according to the accompanying drawings for the convenience of explanation but not for limitation. The names of elements and the wording recited in the disclosure all have ordinary meanings in the art unless otherwise stated. Therefore, a person skilled in the art can unambiguously understand their meanings.

Figure 1:
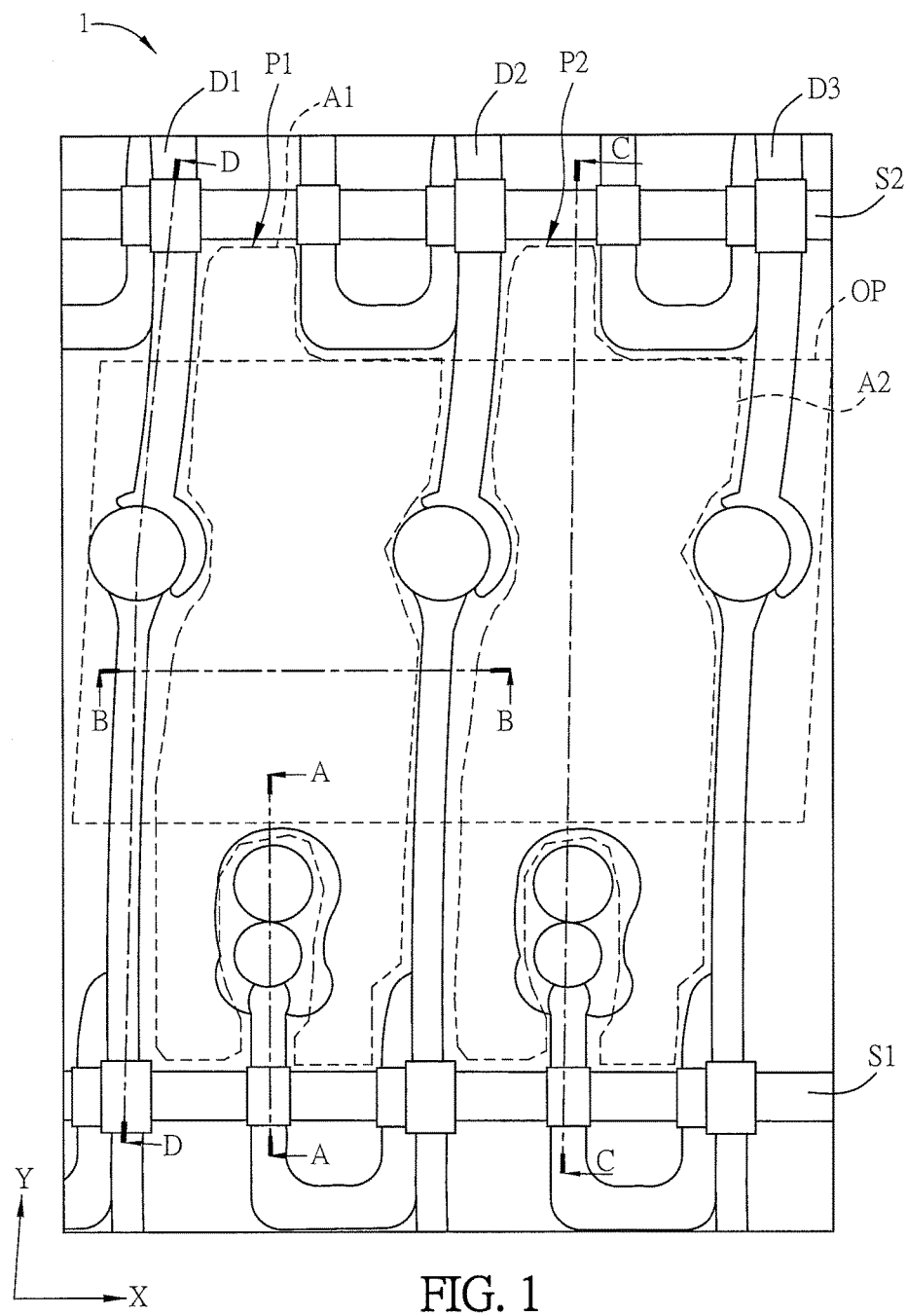
FIG. 1 is a schematic diagram showing a TFT substrate according to an embodiment of the disclosure.

FIG. 1 is a schematic diagram showing a TFT substrate according to an embodiment of the disclosure, and FIGS. 2A to 2D are sectional views of the TFT substrate of FIG. 1 along the line A-A, the line B-B, the line C-C and the line D-D, respectively.

Referring to FIGS. 1 and 2A to 2D, a TFT substrate 1 includes a substrate 11, a plurality of scan lines and a plurality of data lines. The scan lines and the data lines are disposed on the substrate 11.

The substrate 11 is made of a transparent material. In practice, the material of the substrate 11 can be glass, quartz or the likes, plastic, rubber, glass fiber or other polymers. For example, the substrate 11 can be an alkali-free borate glass substrate.

The scan lines are disposed on the substrate 11 along a first direction X. The scan lines are intersected with the data lines to define at least two sub-pixel units, including a first sub-pixel unit P1 and a second sub-pixel unit P2, which are disposed adjacent to each other along the first direction X. In this embodiment, the TFT substrate 1 of FIG. 1 includes two scan lines (a first scan line S1 and a second scan line S2) and three data lines (a first data line D1, a second data line D2 and a third data line D3), which are intersected to define the first sub-pixel unit P1 and the second sub-pixel unit P2. As shown in FIG. 1, the first sub-pixel unit P1 and the second sub-pixel unit P2 are disposed adjacent to each other along the first direction X. Besides, the structures of the first sub-pixel unit P1 and the second sub-pixel unit P2 can be the same or different. The first sub-pixel unit P1 at least includes the region within the first scan line S1, the second scan line S2, the first data line D1 and the second data line D2, and the second sub-pixel unit P2 at least includes the region within the first scan line S1, the second scan line S2, the second data line D2 and the third data line D3.

The first scan line S1 and the second scan line S2 extend along the first direction X, while the first data line D1, the second data line D2 and the third data line D3 extend along a second direction Y. An included angle between the first direction X and the second direction Y can be a right angle, an acute angle or an obtuse angle. In this embodiment, the included angle θ between the first direction X and the second direction Y can be an acute angle (less than 90 degrees) for example.

Figure 2A:
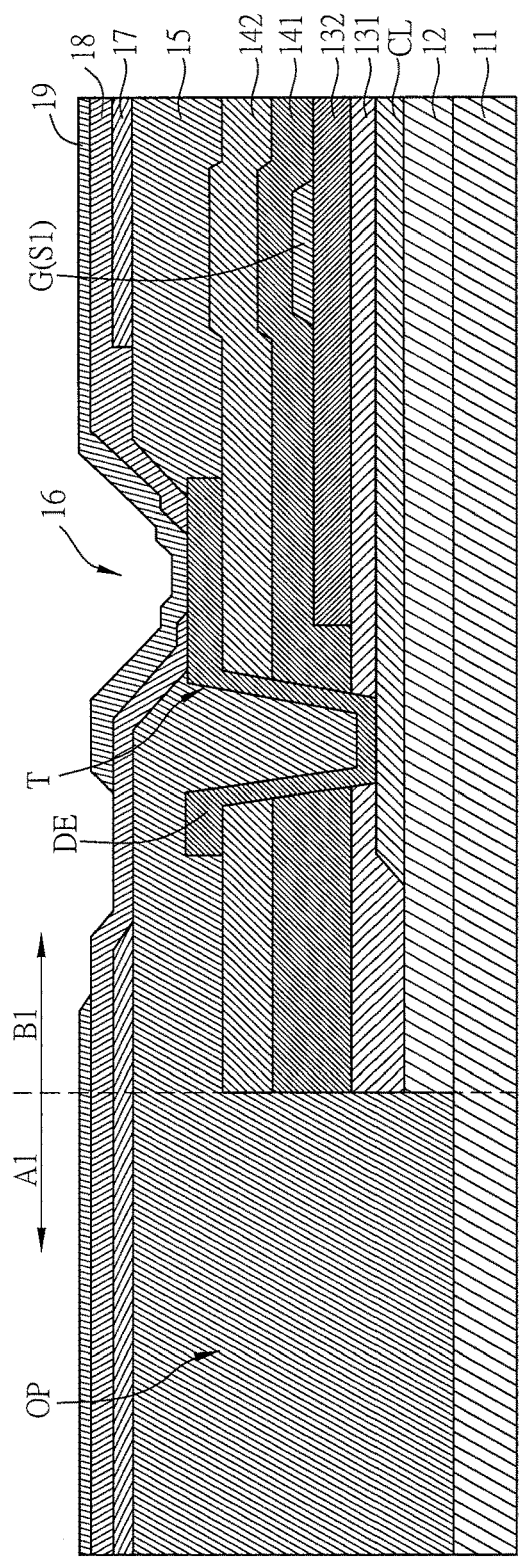
FIGS. 2A to 2D are sectional views of the TFT substrate of FIG. 1 along the line A-A, the line B-B, the line C-C and the line D-D, respectively.

Referring to FIGS. 1 and 2A, each of the first sub-pixel unit P1 and the second sub-pixel unit P2 has a light transmission area and a component installation area disposed adjacent to the light transmission area. In more detailed, the first sub-pixel unit P1 has a first light transmission area A1 and a first component installation area B1, and the second sub-pixel unit P2 has a second light transmission area A2 and a second component installation area B2 (not shown). For example, when the TFT substrate 1 is assembled with a counter substrate and a liquid crystal layer to form a LCD (liquid crystal display) panel, the light emitted from the backlight module can pass through the light transmission areas A1 and A2 of the first sub-pixel unit P1 and the second sub-pixel unit P2. The component installation areas B1 and B2 of the first sub-pixel unit P1 and the second sub-pixel unit P2 are configured for installing the driving components (e.g. TFT), and these areas are covered by the black matrix (BM) so that the light emitted from the backlight module can't pass through the component installation areas B1 and B2. FIG. 2A shows a part of the first light transmission area A1 and the first component installation area B1 of the first sub-pixel unit P1 in the TFT substrate 1.

Each of the first sub-pixel unit P1 and the second sub-pixel unit P2 includes a TFT T on the substrate 11. A planarization layer 15 is disposed on the substrate 11. The TFT T includes at least one intermediate layer (dielectric layer) for insulating the electrodes (gate, source and drain) of the TFT T. The intermediate layer will be further discussed hereinafter. In some embodiments, the TFT T includes a buffer layer 12, a channel layer CL, a first gate insulation layer 131, a second gate insulation layer 132, a gate G, a first interlayer dielectric 141, a second interlayer dielectric 142, a source and a drain, which are disposed on the substrate.

According to some embodiments, in order to increase the transmittance of the light transmission area of the sub-pixel unit, a part of the intermediate layer in the light transmission area of the sub-pixel unit is removed. In practice, after forming the intermediate layer of the TFT, a part of the intermediate layer is removed to form an opening. The opening is at least partially overlapped with the first light transmission area of the first sub-pixel unit and is at least partially overlapped with the second light transmission area of the second sub-pixel unit. Accordingly, the light path can travel through less intermediate layer, which indicates that the light transmission area of the sub-pixel unit has a higher transmittance. As a result, the TFT substrate can have a higher transmittance.

In some embodiments, the TFT substrate can be manufactured by the following steps of: forming a first metal layer, a channel layer and an intermediate layer on the substrate 11; and removing a part of the intermediate layer to form an opening. The first metal layer can configure a plurality of scan lines along the first direction X and the gates G of the TFTs in the first sub-pixel unit P1 and the second sub-pixel unit P2.

The opening can be formed by removing a predetermined part (the light transmission area A1) of the intermediate layer. In this embodiment, the intermediate layer of the TFT can contain a plurality of films. In some embodiments, all films of the intermediate layer corresponding to the first and second transmission areas are removed. For example, the buffer layer 12, the first gate insulation layer 131, the second gate insulation layer 132, the first interlayer dielectric 141, and the second interlayer dielectric 142 corresponding to the first light transmission area A1 and the second light transmission area A2 are removed until exposing the substrate 11, thereby forming an opening OP as shown in FIGS. 1 and 2A. The buffer layer 12, the first gate insulation layer 131, the second gate insulation layer 132, the first interlayer dielectric 141, and the second interlayer dielectric 142 are still exist in the component installation area B1. As shown in the figures, the opening OP of the intermediate layer is at least partially overlapped with the first light transmission area A1 and is also partially overlapped with the second light transmission area A2. That is, the intermediate layer can be partially existed in the first light transmission area A1 and the second light transmission area A2.

After forming the opening OP, a second metal layer is formed on the substrate 11 so as to form a plurality of data lines (e.g. the first data line D1, the second data line D2 and the third data line D3) and the source and drain of the TFT. Then, a planarization layer 15 is formed to cover the TFT T and the substrate 11.

Figure 2B:
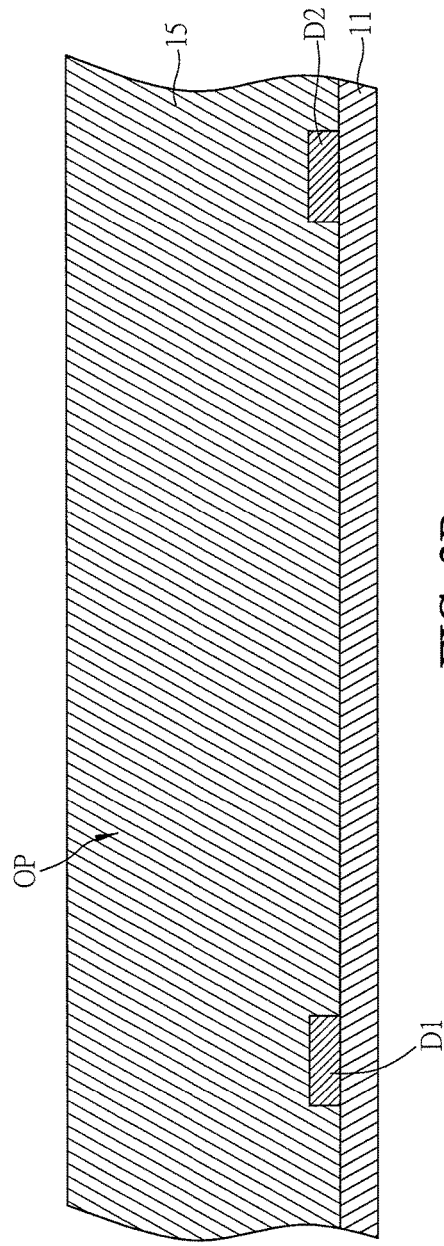
Figure 2C:
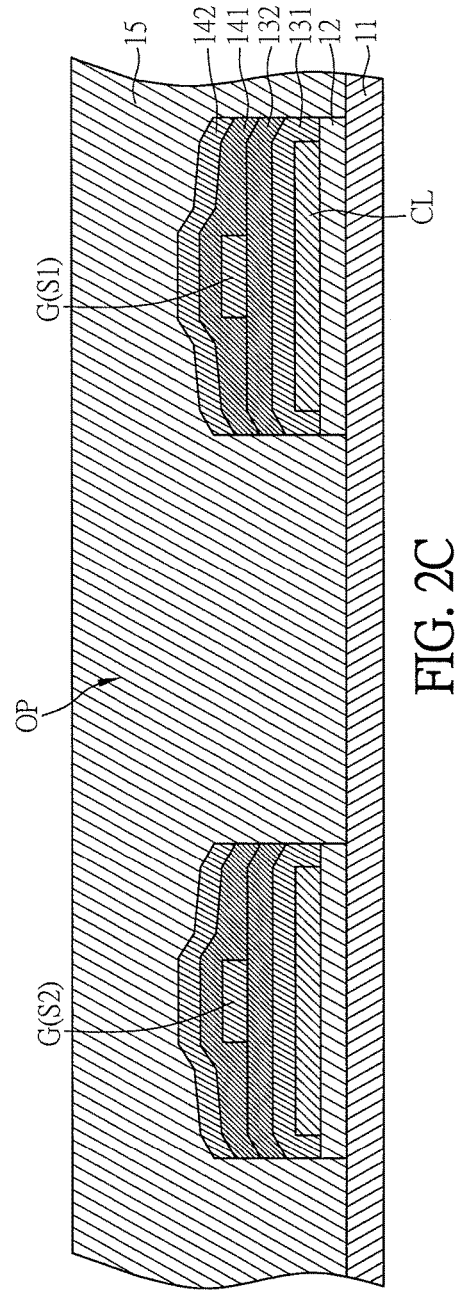
Figure 2D:
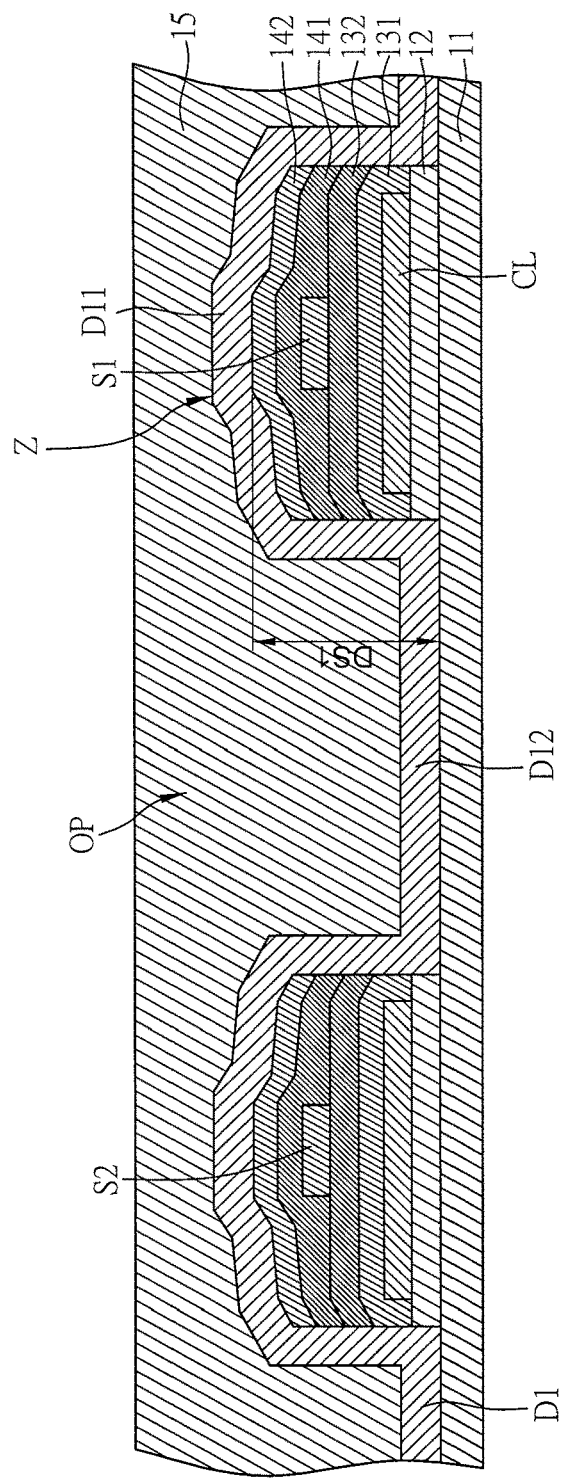

Referring to FIGS. 2B to 2D, only the planarization layer 15, the substrate 11 and the layers between the planarization layer 15 and the substrate 11 are shown in the figures.

As shown in FIG. 2B, the part of the substrate 11 corresponding to the opening OP of the intermediate layer is exposed, so the second metal layer can be directly formed on the exposed part of the substrate 11. That is, the first data line D1 and the second data line D2 are formed on the substrate 11 and directly contacted with the substrate 11. In other words, there is no intermediate layer (insulation layer, buffer layer or dielectric layer) configured between the first data line D1 and the substrate 11 and between the second data line D2 and the substrate 11. In addition, the planarization layer 15 extends from the light transmission area A1 of the first sub-pixel unit P1 to the light transmission area A2 of the second sub-pixel unit P2, and directly covers the first data line D1, the second data line D2 and the substrate 11.

As shown in FIG. 2C, the buffer layer 12, the channel layer CL, the first gate insulation layer 131, the second gate insulation layer 132, the gate G (the first scan line S1 or the second scan line S2), the first interlayer dielectric 141, and the second interlayer dielectric 142 are sequentially formed on the substrate 11, and the planarization layer 15 covers the entire second interlayer dielectric 142 and the substrate 11, thereby achieving the desired planarization.

As shown in FIG. 2D, the first scan line S1 is intersected with the first data line D1 to form an intersection area Z, and a protruding portion D11 of the first data line D1 is located corresponding to the intersection area Z. Similarly, the second scan line S2 is intersected with the first data line D1 to form an additional intersection area, and another protruding portion of the first data line D1 is located corresponding to the additional intersection area. In addition, at least an intermediate layer is configured between the protruding portion D11 of the first data line D1 and the substrate 11. For example, the buffer layer 12, the channel layer CL, the first gate insulation layer 131, the second gate insulation layer 132, the first scan line S1 or the second scan line S2, the first interlayer dielectric 141, and the second interlayer dielectric 142 can be formed between the protruding portion D11 and the substrate 11. Accordingly, the protruding portion D11 of the first data line D1 is not directly contacted with the substrate 11.

Furthermore, the first data line D1 further includes a linear extending portion D12 connected to the protruding portion D11, and the linear extending portion D12 is directly contacted with the substrate 11. In other words, the first data line D1 is at least partially directly contacted with the substrate 11. In this case, the linear extending portion D12 of the first data line D1 is disposed corresponding to the opening OP of the intermediate layer. As shown in FIG. 2D, a distance DS1 between the substrate 11 and the protruding portion D11 of the first data line D1 is greater than a distance between the substrate 11 and the linear extending portion D12 of the first data line D1. Since the linear extending portion D12 is directly contacted with the substrate 11, the distance therebetween is zero.

The planarization layer 15 is continuously disposed on the first light transmission area and the first component installation area of the first sub-pixel unit P1 and the second light transmission area and the second component installation area of the second sub-pixel unit P2, and is extended from the component installation area B1 to the light transmission area A1. In addition, the planarization layer 15 is at least partially contacted with the substrate 11 within the light transmission area A1 of the first sub-pixel unit P1 and the light transmission area A2 of the second sub-pixel unit P2. In some embodiments, in a position corresponding to the opening OP of the first intermediate layer, the planarization layer 15 is at least partially directly contacted with the substrate. As shown in FIG. 2C, parts of the intermediate layer corresponding to the first light transmission area A1 and the second light transmission area A2 are removed to form the openings OP and expose the corresponding parts of the substrate 11, and the planarization layer 15 is filled in the openings OP. Thus, the planarization layer 15 is directly formed on the corresponding parts of the substrate 11. That is, the planarization layer 15 is at least partially directly contacted with the substrate 11 within the first light transmission area A1 and the second light transmission area A2. The material of the planarization layer 15 may include, for example, organic or inorganic insulation material, such as polyethylene naphthalate (PEN), poly-methyl methacrylate (PMMA), or polyimide (PI), and this disclosure is not limited.

Figure 3A:
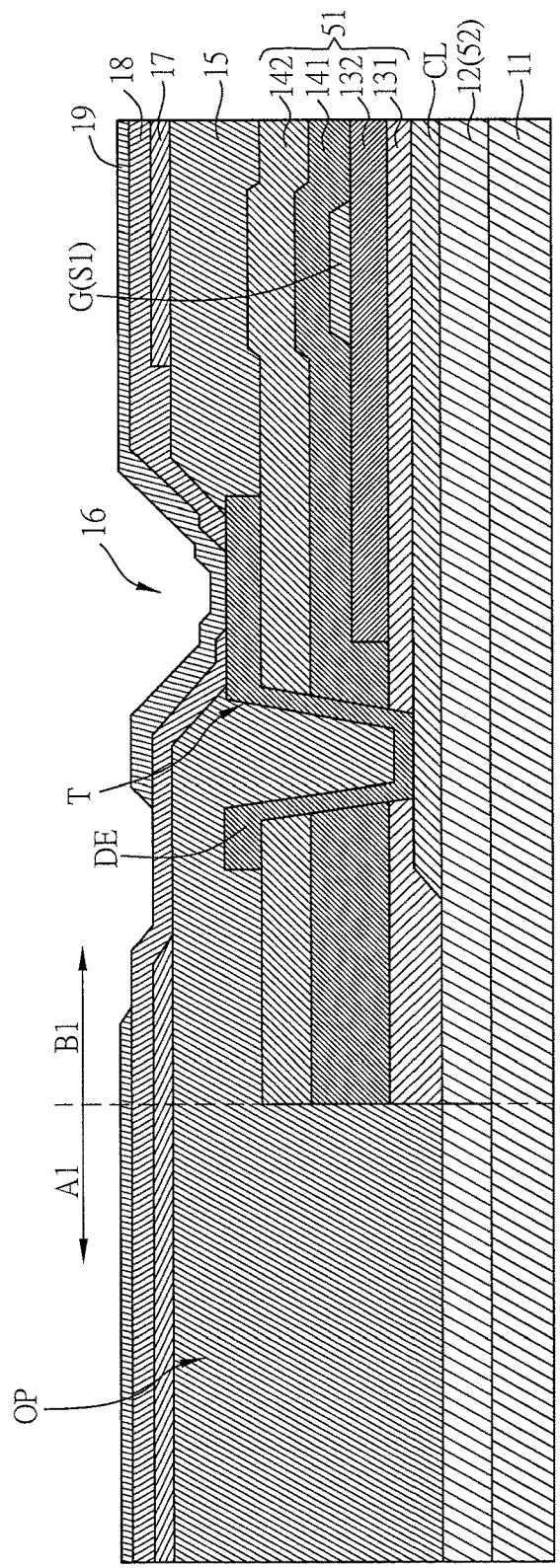
FIGS. 3A to 3D are additional sectional views of the TFT substrate of FIG. 1 along the line A-A, the line B-B, the line C-C and the line D-D, respectively.

In some embodiments, it is also possible to remove only a part of the films of the intermediate layer within the first and second light transmission areas. That is, not all of the buffer layer 12, the first gate insulation layer 131, the second gate insulation layer 132, the first interlayer dielectric 141, and the second interlayer dielectric 142 are removed. Referring to FIGS. 1 and 3A, at least one film of the intermediate layer within the predetermined light transmission area A1 is removed so as to form an opening OP, and a second intermediate layer 52 is optionally remained in the light transmission area A1. In other words, at least one or some of the buffer layer 12, the first gate insulation layer 131, the second gate insulation layer 132, the first interlayer dielectric 141, and the second interlayer dielectric 142 can be remained. In some embodiments, as shown in FIG. 3A, the TFT T includes two parts of intermediate layers, which includes a first intermediate layer 51 containing the films being removed corresponding to the light transmission area A1, and a second intermediate layer 52 containing the films being remained in the opening of the first intermediate layer 51. For example, the first gate insulation layer 131, the second gate insulation layer 132, the first interlayer dielectric 141, and the second interlayer dielectric 142, which are together named as the first intermediate layer 51, are removed to form the opening OP, and the buffer layer 12 (named as the second intermediate layer 52) is remained within the opening OP.

The first intermediate layer 51 can be any one or more films of the intermediate layer of the TFT. Similarly, the second intermediate layer 52 can also be any one or more films of the intermediate layer of the TFT. For example, the first intermediate layer 51 can be any one of the buffer layer 12, the first gate insulation layer 131, the second gate insulation layer 132, the first interlayer dielectric 141, and the second interlayer dielectric 142, or their combinations. The second intermediate layer 52 can also be any one of the buffer layer 12, the first gate insulation layer 131, the second gate insulation layer 132, the first interlayer dielectric 141, and the second interlayer dielectric 142, or their combinations. The thickness of the first intermediate layer 51 can be less than that of the second intermediate layer 52, and the amount of films of the first intermediate layer 51 can be less than that of the second intermediate layer 52.

Figure 3B:
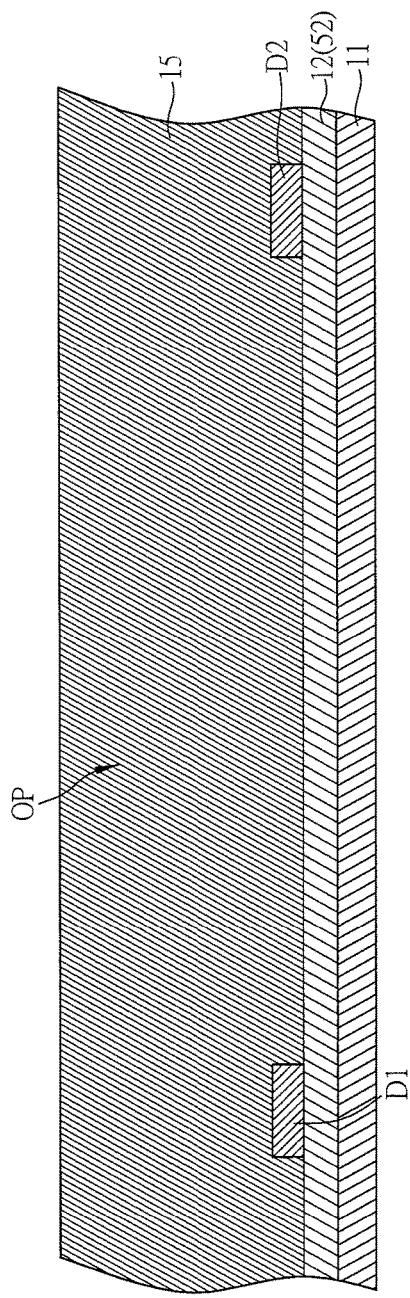
Figure 3C:
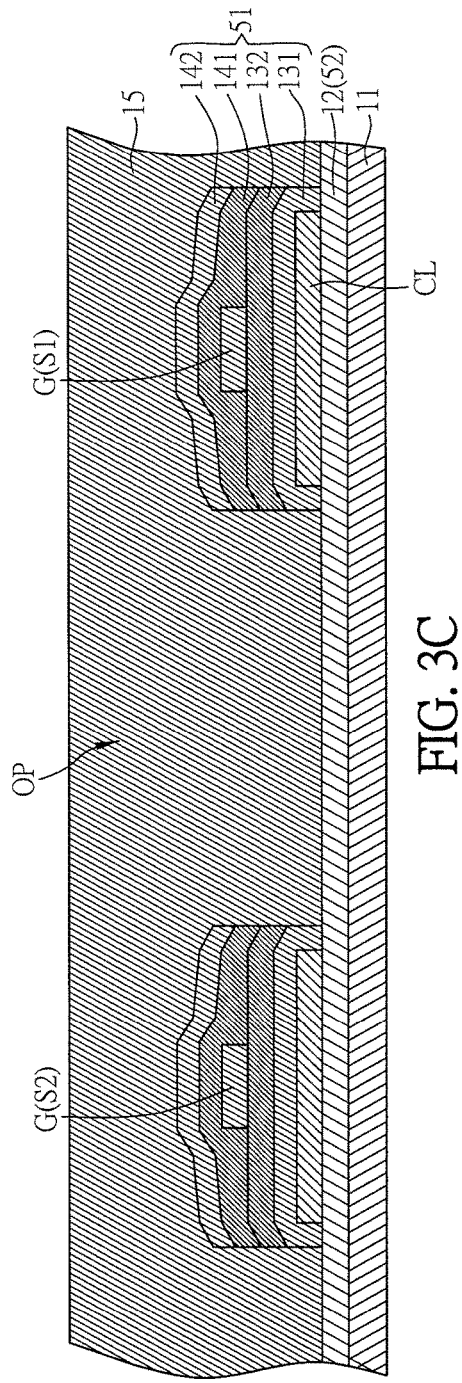
Figure 3D:
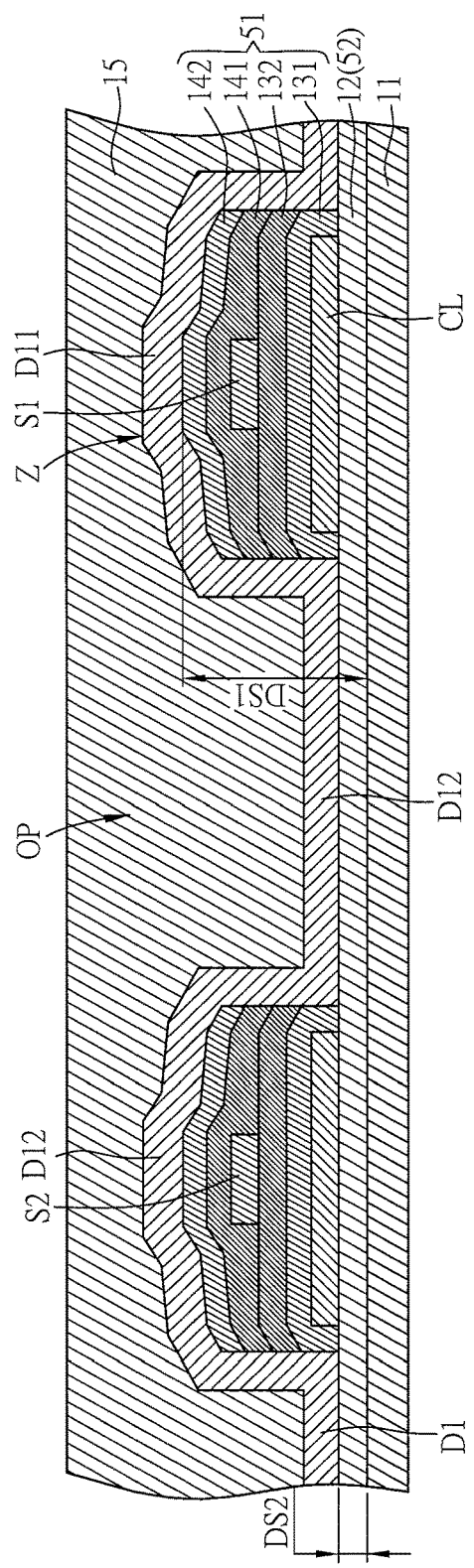

Referring to FIGS. 3A and 3C, the planarization layer 15 is not directly contacted with the substrate 11 corresponding to the opening OP of the intermediate layer. Corresponding to the opening OP of the intermediate layer, the second intermediate layer 52 is disposed between the substrate 11 and the planarization layer 15. As shown in FIG. 3B, corresponding to the opening OP of the intermediate layer, the first data line D1 and the second data line D2 are not directly contacted with the substrate 11. In this case, the second intermediate layer 52 is disposed between the substrate 11 and the first data line D1 and between the substrate 11 and the second data line D2. As shown in FIG. 3D, corresponding to the opening OP of the intermediate layer, the linear extending portion D12 of the data line D1 is not directly contacted with the substrate 11, and the second intermediate layer 52 is disposed between the substrate 11 and the linear extending portion D12. In addition, the distance DS1 between the substrate 11 and the protruding portion D11 of the first data line D1 is greater than the distance DS2 between the substrate 11 and the linear extending portion D12 of the first data line D1.

The structure of the TFT substrate will be described hereinafter in view of some embodiments. Referring to FIG. 2A, the intermediate layer is disposed between the substrate 11 and the planarization layer 15, and is extended from the component installation area B1 to the junction region between the component installation area B1 and the light transmission area A1, and the detailed description thereof will be discussed below. The material of the intermediate layer may include silicon nitride, silicon oxide, silicon oxynitride, silicon carbide, aluminum oxide, hafnium oxide, or combinations thereof. The intermediate layer can be a buffer layer, an interlayer dielectric (ILD), a gate insulator, or any other insulation layer, or their combinations.

In more detailed, at least one intermediate layer is disposed in the TFT of the first sub-pixel unit P1 and in the TFT the second sub-pixel unit P2. For example, the above-mentioned intermediate layer can be any one of the buffer layer 12, the first gate insulation layer 131, the second gate insulation layer 132, the first interlayer dielectric 141, and the second interlayer dielectric 142, or any of their combinations. In one embodiment, the buffer layer 12, the first gate insulation layer 131, the second gate insulation layer 132, the first interlayer dielectric 141, and the second interlayer dielectric 142 are all disposed in the component installation area B1 and extended from the component installation area B1 to the junction region between the component installation area B1 and the light transmission area A1. Or, alternatively, these films can be extended from the component installation area B1 to a part of the light transmission area A1.

The "junction region" does not refer to a strict line or strict surface between the component installation area B1 and the light transmission area A1, but refers to a region adjacent to the junction of the component installation area B1 and the light transmission area A1. In addition, in some embodiments, the buffer layer 12, the first gate insulation layer 131, the second gate insulation layer 132, the first interlayer dielectric 141, and the second interlayer dielectric 142 are located within the component installation area B1 and are not located in the light transmission area A1. Or, alternatively, in some embodiments, the buffer layer 12, the first gate insulation layer 131, the second gate insulation layer 132, the first interlayer dielectric 141, and the second interlayer dielectric 142 can be located within the component installation area B1 and can also be extended to a part of the light transmission area A1. In some embodiments, the buffer layer 12, the first gate insulation layer 131, the second gate insulation layer 132, the first interlayer dielectric 141, and the second interlayer dielectric 142 can be formed by deposition, and then a part of the intermediate layer within the predetermined light transmission area A1 can be removed by etching. For example, parts of the buffer layer 12, the first gate insulation layer 131, the second gate insulation layer 132, the first interlayer dielectric 141, and the second interlayer dielectric 142 are etched away until exposing the substrate 11 so as to form the opening OP.

In this embodiment, the buffer layer 12 is disposed on the substrate 11 and is disposed corresponding to the component installation area B1. The buffer layer 12 can be a single-layer or multilayer structure, and the material thereof may include silicon nitride, silicon oxide, silicon oxynitride, silicon carbide, aluminum oxide, or hafnium oxide. This disclosure is not limited. When the buffer layer 12 is a multilayer structure, different films of the buffer layer 12 can be made of different materials.

The TFT T is disposed on the buffer layer 12 and located corresponding to the component installation area B1. In this embodiment, the TFT T is an FFS (fringe field switching) TFT, but this disclosure is not limited. The TFT T can be a top gate TFT or a bottom gate TFT. In this embodiment, the TFT T is a top gate TFT for example. In more detailed, the TFT T includes a gate a channel layer CL, a drain DE and a source (not shown). The gate G is coupled to the first scan line S1. The channel layer CL is located corresponding to the gate G and disposed on the buffer layer 12, and the channel layer CL can be disposed between the gate G and the substrate 11. In practice, the channel layer CL is a semiconductor layer, such as a silicon semiconductor, a gallium semiconductor, germanium semiconductor, their combinations, or the likes. The material of the channel layer CL can be, for example but not limited to, an oxide semiconductor. The oxide semiconductor includes an oxide, which includes at least one of indium, gallium, zinc and tin. For example, the oxide contained in the oxide semiconductor can be indium gallium zinc oxide (IGZO). In addition, the drain DE and the source are separately disposed on the channel layer CL and contacted with the channel layer CL. The source is coupled to the first data line D1. When the channel layer CL of the TFT T is not conducted, the drain DE and the source are electrically isolated. The drain DE and the source can be a single-layer structure or a multilayer structure made of metal, such as aluminum, copper, silver, molybdenum, or titanium, or their alloys. Besides, some traces configured for transmitting the driving signals (e.g. the data line) can be made of the same process for forming the drain DE and the source.

The gate G is disposed corresponding to the channel layer CL and can be located above the channel layer CL. The gate G can be a single-layer structure or a multilayer structure made of metal, such as aluminum, copper, silver, molybdenum, or titanium, or their alloys. Besides, some traces configured for transmitting the driving signals (e.g. the scan line) can be electrically coupled and can be the same layer and made of the same process for forming the gate G. In addition, the first gate insulation layer 131 and the second gate insulation layer 132 are sequentially disposed on the buffer layer 12. The first gate insulation layer 131 covers the entire channel layer CL. The second gate insulation layer 132 is disposed on the first gate insulation layer 131, and the gate G is disposed on the second gate insulation layer 132. In other embodiments, if the TFT T is a bottom gate TFT, the gate G is disposed between the channel layer CL and the substrate 11, and at least one gate insulation layer is configured between the gate G and the channel layer CL.

The first interlayer dielectric 141 and the second interlayer dielectric 142 are sequentially disposed on the second gate insulation layer 132. The first interlayer dielectric 141 covers the entire gate G and second gate insulation layer 132, and the second interlayer dielectric 142 covers the first interlayer dielectric 141.

In some embodiment, each of the first sub-pixel unit P1 and the second sub-pixel unit P2 includes a common electrode layer 17, a passivation layer 18 and a pixel electrode layer 19. The common electrode layer 17 is disposed on the planarization layer 15, and the passivation layer 18 is disposed on the common electrode layer 17 and covers the common electrode layer 17. The pixel electrode layer 19 is disposed on the passivation layer 18 and partially covers the passivation layer 18. In this case, the common electrode layer 17, the passivation layer 18 and the pixel electrode layer 19 are sequentially disposed on the planarization layer 15, and are disposed corresponding to the component installation area B1 and the light transmission area A1. In addition, the pixel electrode layer 19 is electrically connected with the drain DE via a through hole 16. The drain DE is disposed and coupled to the channel layer CL via another through hole formed in the first gate insulation layer 131, the first interlayer dielectric 141, and the second interlayer dielectric 142. Then, the through hole 16 is formed in the planarization layer 15 and the passivation layer 18 so as to expose the drain DE. Next, the pixel electrode layer 19 is disposed in the through hole 16 so as to contact and electrically connect the drain DE.

The common electrode layer 17 or the pixel electrode layer 19 can be made of transparent conductive material such as ITO, IZO, AZO, CTO, SnO$_2$, or ZnO, and this disclosure is not limited. In addition, the passivation layer 18 can be made of inorganic material such as silicon nitride, silicon oxide, silicon oxynitride, silicon carbide, aluminum oxide, or hafnium oxide, or a multilayer structure containing the above materials.

As shown in FIG. 2D, when sequentially forming the buffer layer 12, the first gate insulation layer 131, the second gate insulation layer 132, the first interlayer dielectric 141 and the second interlayer dielectric 142 on the substrate 11, the edges of the opposite sides of the buffer layer 12, the first gate insulation layer 131, the second gate insulation layer 132, the first interlayer dielectric 141 and the second interlayer dielectric 142 can have oblique parts (not right angles but obtuse angles). This configuration can decrease the risk of breaking the edges when forming the first data line D1 or the second data line D2 on the second interlayer dielectric 142 and the substrate 11. In addition, the planarization layer 15 completely covers the second interlayer dielectric 142, the substrate 11, the data lines and the scan lines, thereby achieving the desired planarization.

As mentioned above, in the TFT substrate 1, a part of the intermediate layer corresponding to the light transmission area is removed. Accordingly, the light transmission areas of the first sub-pixel unit P1 and the second sub-pixel unit P2 have less intermediate layers. Thus, when the light emitted from the backlight module passes through the light transmission areas of the TFT substrate 1, the ratio of light absorbed or the ratio of light reflected can be decreased. As a result, the TFT substrate 1 can have a higher transmittance.

Figure 4:
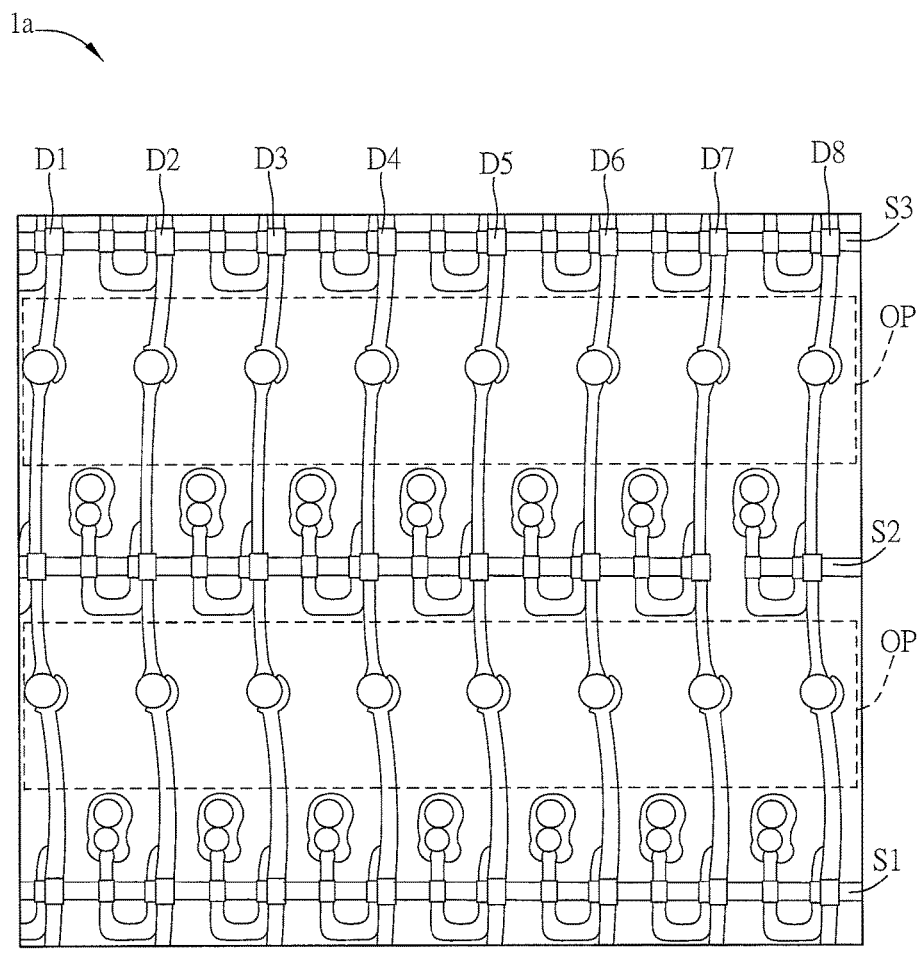
FIG. 4 is a schematic diagram showing a TFT substrate of another aspect of the disclosure.

FIG. 4 is a schematic diagram showing a TFT substrate 1a according to another aspect of the disclosure.

Different from the TFT substrate 1, the TFT substrate 1a of FIG. 4 includes three scan lines (the first scan line S1 to the third scan line S3) and eight data lines (the first data line D1 to the eighth data line D8). The scan lines S1 to S3 are intersected with the data lines D1 to D8 so as to define two rows of sub-pixel units (totally 14 sub-pixel units). Each of the data lines (D1 to D8) has a turning portion at each of the intersections defined by the scan lines S1 to S3 and the data lines D1 to D8. In other words, each of the data lines D1 to D8 is not a straight line but having turning portions.

Each of the 14 sub-pixel units of the TFT substrate 1a can have the same technical features as the above-mentioned first sub-pixel unit P1 (or the second sub-pixel unit P2), so the detailed descriptions thereof will be omitted. In this embodiment, each of the data lines D1 to D8, which define the 14 sub-pixel units, is at least partially contacted with the substrate. In addition, the planarization layer is at least partially contacted with the substrate within the light transmission area of the each sub-pixel unit. Or, alternatively, a second intermediate layer is disposed between the substrate and the data line, and the second intermediate layer is disposed between the planarization layer and the substrate. In some embodiments, in a position corresponding to the opening of the first intermediate layer, the second intermediate layer is disposed between the planarization layer and the substrate. Accordingly, the intermediate layer in the light transmission areas of the 14 sub-pixel units includes smaller amount of films or has a smaller thickness. In this case, the opening OP of the intermediate layer crosses 7 sub-pixel units along the first direction X. Thus, when the light emitted from the backlight module passes through the light transmission areas of the TFT substrate 1a, the ratio of light absorbed or the ratio of light reflected can be decreased. As a result, the TFT substrate 1a can have a higher transmittance.

The above-mentioned opening OP of the intermediate layer, which crosses 27 sub-pixel units, is for an illustration only, and this disclosure is not limited thereto. In some embodiments, the number of sub-pixel units that the opening OP of the intermediate layer crosses is not limited and can depend on the actual requirement. The number of sub-pixel units that the opening OP of the intermediate layer crosses can be other than the above-mentioned 2 or 7 sub-pixel units.

Figure 5A:
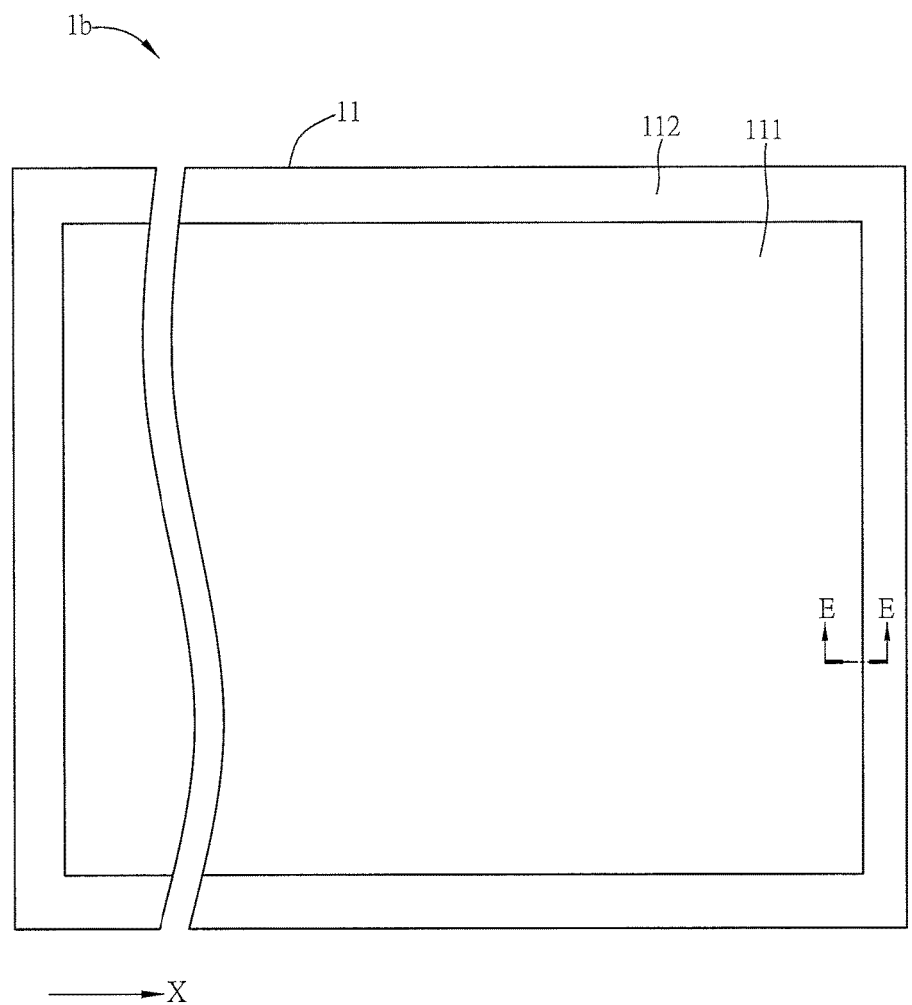
FIG. 5A is a schematic diagram showing a TFT substrate of another aspect of the disclosure.
Figure 5B:
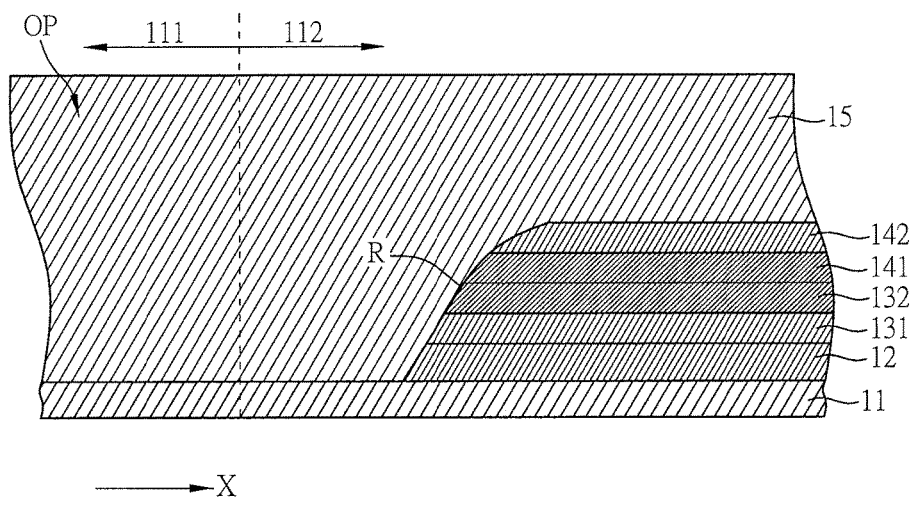
FIG. 5B is a sectional view of the TFT substrate of FIG. 5A along the line E-E.

FIG. 5A is a schematic diagram showing a TFT substrate 1b of another aspect of the disclosure, and FIG. 5B is a sectional view of the TFT substrate 1b of FIG. 5A along the line E-E. FIG. 5A only shows the substrate 11 but doesn't shown the other components or layers, and FIG. 5B only shows the planarization layer 15, the substrate 11, and the intermediate layer disposed between the planarization layer 15 and the substrate 11.

Similar to the above-mentioned TFT substrate 1, the TFT substrate 1b includes a plurality of scan line and a plurality of data lines, which can define a plurality of sub-pixel units (not shown) arranged in an array. Each of the sub-pixel units of the TFT substrate 1b can have the same technical features as the above-mentioned first sub-pixel unit P1 (or the second sub-pixel unit P2).

In this embodiment, the substrate 11 has a display area 111 (pixel unit area) and a peripheral circuit area 112, and the peripheral circuit area 112 is located around the display area 111. The sub-pixel units are located within the display area 111, and the peripheral components, such as the electronic components or traces for driving the scan lines, are disposed within the peripheral circuit area 112. The opening OP of the intermediate layer extends along the first direction X and crosses the entire display area 111 and a part of the peripheral circuit area 112. That is, different from the above TFT substrates, the edge of the opening OP of the intermediate layer in the TFT substrate 1b of this embodiment is located in the peripheral circuit area 112 instead of the sub-pixel unit of the display area 111. In addition, the planarization layer 15 is disposed in the display area 111 and extended from the display area 111 to the peripheral circuit area 112 for covering the substrate 11. Accordingly, the planarization can entirely cover the substrate 11 so as to achieve the planarization. Since the edge of the opening OP of the intermediate layer is located within the peripheral circuit area 112, similar to the above embodiments, the data line corresponding to the opening OP can be at least partially directly contacted with the substrate and the planarization layer corresponding to the opening OP can be also at least partially directly contacted with the substrate. As shown in FIG. 5B, the planarization layer 15 located within the peripheral circuit area 112 is at least partially directly contacted with the substrate 11. Or, alternatively, as mentioned above, in the position corresponding to the opening OP, the second intermediate layer can be disposed between at least a part of the data line and the substrate 11, and the second intermediate layer can be also disposed between at least a part of the planarization layer and the substrate 11.

As shown in FIG. 5B, a part of the planarization layer 15 within the peripheral circuit area 112 is directly contacted with the substrate 11 and covers, for example but not limited to, the buffer layer 12, the first gate insulation layer 131, the second gate insulation layer 132, the first interlayer dielectric 141 and the second interlayer dielectric 142, thereby forming a slant surface R. Accordingly, this embodiment can reduce the absorption, scattering or reflection of the light passing through the sub-pixel units of the entire TFT substrate 1b, and thus improve the transmittance.

Figure 6:
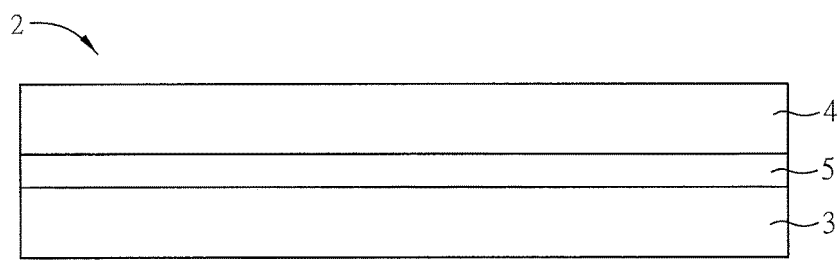
FIG. 6 is a schematic diagram showing a display panel according to an embodiment of the disclosure.

FIG. 6 is a schematic diagram showing a display panel 2 according to an embodiment of the disclosure.

The display panel 2 of this embodiment can be an active matrix display panel. Besides, the display panel 2 is a LCD panel such as, for example but not limited to, an IPS (in-plane switch) LCD panel, an FFS (fringe field switching) LCD panel, a VA mode (vertical alignment mode) LCD panel, or a 3D LCD panel, and this disclosure is not limited.

The display panel 2 includes a TFT substrate 3, a counter substrate 4, and a display medium layer 5. The TFT substrate 3 is disposed opposite to the counter substrate 4, and the display medium layer 5 is disposed between the TFT substrate 3 and the counter substrate 4. The TFT substrate 3, the counter substrate 4 and the display medium layer 5 together form a plurality of sub-pixel units arranged in an array. The sub-pixel units of this embodiment can be referred to the sub-pixel units of the previous embodiments, and the TFT substrate 3 can be any of the above-mentioned TFT substrates 1, 1a and 1b or their modifications. The technologies thereof can be referred to the above embodiments, so the detailed descriptions thereof will be omitted.

The counter substrate 3 can be made of a transparent material such as glass, quartz or the likes. In some embodiments, the counter substrate 3 can be a color filter substrate, and the display medium layer 5 can be a liquid crystal layer. Of course, in other embodiments, if the display panel 2 can be an OLED display panel, the display medium layer can be an OLED layer, and the counter substrate can be a protection substrate. This discource is not limited.

To sum up, according to some embodiments, in the TFT substrate and display panel of the disclosure, a part of the intermediate layer located corresponding to the light transmission area is removed, so that at least a part of the data line is directly contacted with the substrate and at least a part of the planarization layer is directly contacted with the substrate. Or, alternatively, in some embodiments, the second intermediate layer is disposed between the substrate and at least a part of the data line and between the substrate and at least a part of the planarization layer. Accordingly, the intermediate layer corresponding to the light transmission areas of the sub-pixel units can have a smaller amount of films or a thinner thickness. Thus, when the light emitted from the backlight module passes through the light transmission area of the TFT substrate, the ratio of light absorbed or ratio of light reflected can be reduced. As a result, the TFT substrate and the display panel can have a higher transmittance.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising a TFT substrate, the TFT substrate comprising:
a substrate;
a plurality of scan lines and a plurality of data lines, wherein the scan lines are disposed on the substrate along a first direction, the scan lines are intersected with the data lines to define a plurality of sub-pixel units, the sub-pixel units comprise a first sub-pixel unit and a second sub-pixel unit, which are disposed adjacent to each other along the first direction, the first sub-pixel unit has a first light transmission area and a first component installation area, and the second sub-pixel unit has a second light transmission area and a second component installation area; and
a first intermediate layer disposed on the substrate, wherein the first intermediate layer has an opening, and the opening exposes a part of the substrate and is at least partially overlapped with the first light transmission area, and is at least partially overlapped with the second light transmission area;
wherein the scan lines comprise a first scan line, the data lines comprise a first data line, the first scan line and the first data line are intersected to form a cross area, the first data line has a protruding portion corresponding to the cross area, and the first intermediate layer is disposed between the substrate and the protruding portion of the first data line.

2. The display panel of claim 1, wherein the first intermediate layer is a multilayer structure.

3. The display panel of claim 1, wherein the first data line further has a linear extending portion connected to the protruding portion, and a distance between the substrate and the protruding portion is greater than that between the substrate and the linear extending portion.

4. The display panel of claim 3, wherein the linear extending portion of the first data line directly contacts the substrate.

5. The display panel of claim 3, wherein the TFT substrate further comprises: a second intermediate layer disposed between the substrate and the linear extending portion of the first data line.

6. The display panel of claim 5, wherein the TFT substrate further comprises: a planarization layer continuously disposed on the first light transmission area and the first component installation area of the first sub-pixel unit and the second light transmission area and the second component installation area of the second sub-pixel unit, wherein in a position corresponding to the opening of the first intermediate layer, the second intermediate layer is disposed between the planarization layer and the substrate.

7. The display panel of claim 1, wherein the TFT substrate further comprises: a planarization layer continuously disposed on the first light transmission area and the first component installation area of the first sub-pixel unit and the second light transmission area and the second component installation area of the second sub-pixel unit, wherein the first intermediate layer is disposed between the planarization layer and the substrate.

8. The display panel of claim 7, wherein in a position corresponding to the opening of the first intermediate layer, the planarization layer is at least partially directly contacted with the substrate.

9. The display panel of claim 7, wherein the TFT substrate further comprises:
   a TFT disposed on the substrate and located corresponding to the first component installation area or the second component installation area, wherein the planarization layer covers the TFT, and the TFT comprises the first intermediate layer.

10. The display panel of claim 7, wherein the substrate has a display area and a peripheral circuit area, the peripheral circuit area is disposed around the display area, the first sub-pixel unit and the second sub-pixel unit are located within the display area, the planarization layer extends from the display area to the peripheral circuit area, and a part of the planarization layer located in the peripheral circuit area is at least partially directly contacted with the substrate.

11. A manufacturing method of a display panel, comprising steps of:
   providing a substrate;
   forming a first metal layer on the substrate so as to form a plurality of scan line extending along a first direction and gates of TFTs located in a first sub-pixel unit and a second sub-pixel unit, wherein the first sub-pixel unit and the second sub-pixel unit are disposed adjacent to each other along the first direction, the first sub-pixel unit has a first light transmission area and a first component installation area, and the second sub-pixel unit has a second light transmission area and a second component installation area;
   forming a channel layer of the TFTs on the substrate;
   forming an intermediate layer of the TFTs on the substrate;
   forming an opening in the intermediate layer, so that the opening is at least partially overlapped with the first light transmission area and is at least partially overlapped with the second light transmission area, wherein the opening exposes a part of the substrate; and
   after forming the opening, forming a second metal layer on the substrate so as to form a plurality of data lines and sources and drains of the TFTs, wherein a part of the second metal layer is positioned above the intermediate layer, and another part of the second metal layer is positioned in the opening of the intermediate layer;
   wherein the scan lines comprise a first scan line, the data lines comprise a first data line, the first scan line and the first data line are intersected to form a cross area, the first data line has a protruding portion corresponding to the cross area, and the first intermediate layer is disposed between the substrate and the protruding portion of the first data line.

* * * * *